United States Patent
Caresosa et al.

(10) Patent No.: US 6,864,752 B2
(45) Date of Patent: Mar. 8, 2005

(54) CONFIGURABLE VOLTAGE CONTROLLED OSCILLATOR SYSTEM AND METHOD

(75) Inventors: Mario Caresosa, Rancho Santa Margarita, CA (US); Namik Kocaman, Irvine, CA (US); Afshin Momtaz, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/444,022

(22) Filed: May 22, 2003

(65) Prior Publication Data

US 2004/0104781 A1 Jun. 3, 2004

Related U.S. Application Data

(60) Provisional application No. 60/423,074, filed on Nov. 1, 2002.

(51) Int. Cl.[7] .................................................. H03L 7/18
(52) U.S. Cl. ............................ 331/16; 331/1 A; 331/57
(58) Field of Search .............................. 331/1 A, 16, 18, 331/25, 57, 74, 75; 327/156–159; 332/127; 360/51; 375/376; 455/260

(56) References Cited

U.S. PATENT DOCUMENTS

| | | | |
|---|---|---|---|
| 5,929,711 A | * 7/1999 | Ito ............................. 331/1 A |
| 6,163,186 A | * 12/2000 | Kurita ......................... 327/157 |
| 6,236,632 B1 | * 5/2001 | Hayashi .................... 369/59.16 |
| 6,587,411 B2 | * 7/2003 | Hayashi .................... 369/47.29 |
| 6,687,320 B1 | * 2/2004 | Chiu et al. ................. 375/376 |

* cited by examiner

*Primary Examiner*—David Mis
(74) *Attorney, Agent, or Firm*—McAndrews, Held & Malloy

(57) ABSTRACT

A phase lock loop with multiple divider paths is presented herein. The phase lock loop can be used to provide a wide range of frequencies. The phase lock loop can also be used as a portion of a clock multiplier unit or a clock data and recovery unit.

10 Claims, 5 Drawing Sheets

CONFIGURABLE VOLTAGE CONTROLLED OSCILLATOR SYSTEM AND METHOD

RELATED APPLICATIONS

This application claims priority to Provisional Application Ser. No. 60/423,074, "Configurable Voltage Controlled Oscillator System and Method", filed Nov. 1, 2002, by Caresosa, et. al.

This application is related to the following applications that are incorporated herein by reference:

| Ser. No. | Title | Docket No. | Filed | Inventor(s): |
|---|---|---|---|---|
| 60/423,070 | Transceiver System and Method Supporting Variable Rates an Multiple Protocols | 14103US01 | Nov. 1, 2002 | Vikran Natarajan, Kang Xioa, Mario Caresosa, Jay Proano, David Chang, Afshin Momtaz, Randy Stolaruk |
| 60/426,166 | Two Wire Bus for a Transceiver System | 14104US01 | Nov. 1, 2002 | Chenmin Zhang, Steve Thomas, Randall Stolaruk |
| 60/423,294 | System and Method Supporting Auto-Recovery in a Transceiver System | 14105US01 | Nov. 1, 2002 | Kang Xiao, Mario Caresosa, Hongtao Jiang, Randall Stolaruk |
| 60/423,071 | Method Supporting Transceiver and Framer Synchronization | 14106US01 | Nov. 1, 2002 | Jay Proano, Sheila Qiu, Tim Chan, Hongtao Jiang |
| 60/423,034 | Multi-Rate On-Chip OCN Filter for a Transceiver System | 14107US01 | Nov. 1, 2002 | Ichiro Fujimori, Mario Caresosa, and Namik Kocaman |
| 60/423,072 | Transceiver System and Method Supporting Multiple Selectable VCOs | 14108US01 | Nov. 1, 2002 | Mario Caresosa, Namik Kocaman |

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

The present invention relates to Optical Internetworking, and more particularly to a multi-rate transceiver with Rate Adaptation.

Synchronous Optical Networking (SONET) is a standard way to multiplex high-speed traffic from multiple vendors' multiplexers onto fiber optic cabling. SONET equipment and software enable network providers to carry traffic from many types of customer equipment in a uniform way on backbone fiber optic cabling.

SONET is slightly different in the long haul space compared to the metro space. The long haul space is [please fill in the blank with a brief description of the long haul space]. The metro space is [please fill in the blank with a brief description of the metro space]. SONET for the metro space provides additional functionality for other protocols, such as Gigabit Ethernet, ESCON, FIBERCON, Fiber Channel 2X, and HDTV, to name a few.

Service providers provide services to various customers by provisioning a line card for the customer. Line cards handle one of a several standard rates. TABLE 1 identifies a list of different rates. In order to provide customers with different data rates, service providers install different line cards, wherein each line card handles a different data rate. In cases where a service provider has many customers, it is likely that the service provider has many line cards to accommodate the different user requirements. However, in cases where a service provider has fewer customers, it is likely that the service provider will need to purchase a new line card to accommodate a new customer with different rate requirements.

TABLE 1

| Optical Level | Electrical Level | Line Rate (Mbps) | Payload Rate (Mbps) | Overhead Rate (Mbps) |
|---|---|---|---|---|
| OC-1 | STS-1 | 51.840 | 50.112 | 1.728 |
| OC-3 | STS-3 | 155.520 | 150.336 | 5.184 |
| OC-9 | STS-9 | 466.560 | 451.008 | 15.552 |
| OC-12 | STS-12 | 622.080 | 601.344 | 20.736 |
| OC-18 | STS-18 | 933.120 | 902.016 | 31.104 |
| OC-24 | STS-24 | 1244.160 | 1202.688 | 41.472 |
| OC-36 | STS-36 | 1866.240 | 1804.032 | 62.208 |
| OC-48 | STS-48 | 2488.320 | 2405.376 | 82.944 |

In order to provide different data rates from the same infrastructure, reference clock signals with different frequencies are needed.

Accordingly it would be advantageous to provide a voltage controlled oscillator (VCO) which can provide signals of multiple frequencies.

Further limitations and disadvantages of connection and traditional approaches will become apparent to one of skill in the art, through comparison of such systems with embodiments of the present invention as set forth in the remainder of the present application.

BRIEF SUMMARY OF THE INVENTION

Presented herein is a phase lock loop with multiple divider paths. A particular one of the divider paths can be selected, thereby allowing for generation of an output signal with any one of a plurality of frequencies. The phase lock loop can form a portion of a clock and data recovery unit (CDR) or a clock management unit (CMU) in a multirate transceiver.

These and other advantages, aspects and novel features of the present invention, as well as details of illustrated embodiments thereof, will be more fully understood from the following description and drawings.

DETAILED DESCRIPTION OF THE INVENTION

Figure 1:
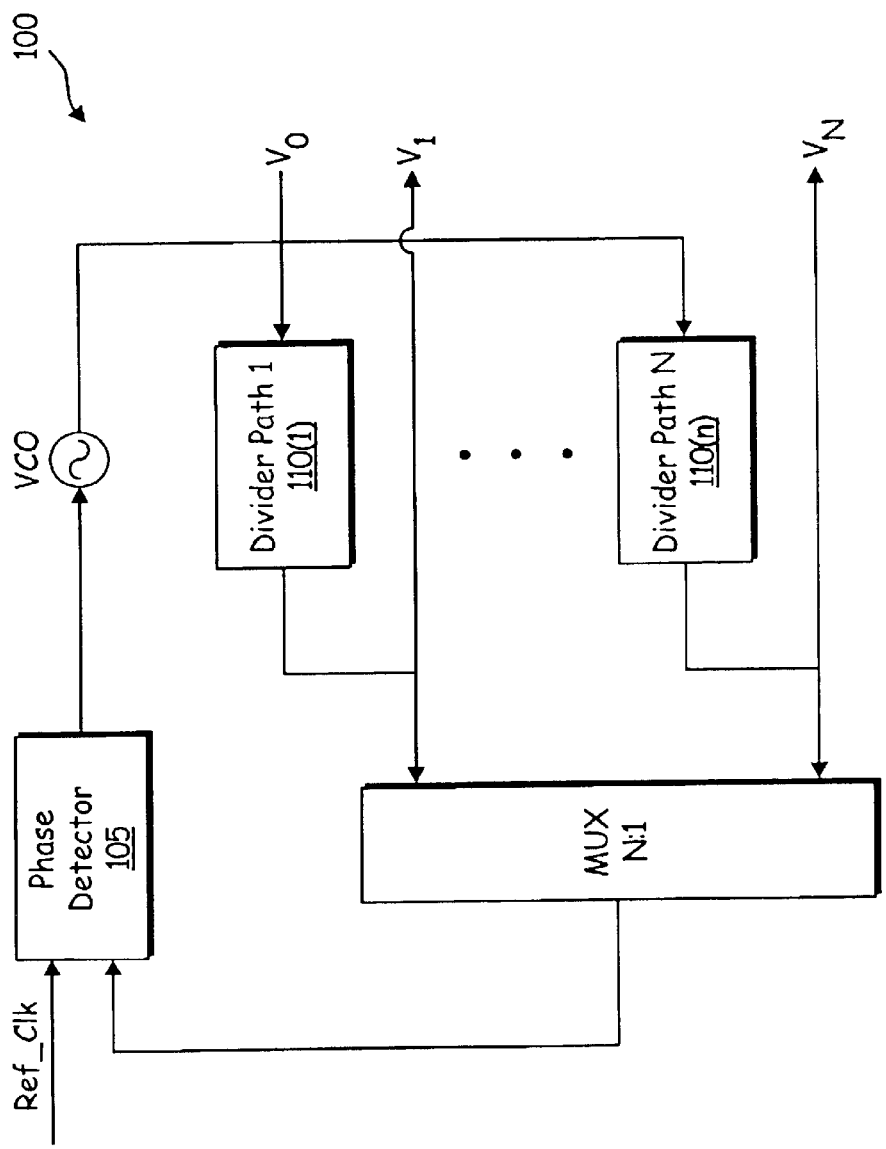
FIG. 1 is a block diagram of an exemplary phase lock loop with multiple divider paths in accordance with an embodiment of the invention.

Referring now to FIG. 1, there is illustrated a block diagram of an exemplary phase lock loop 100 in accordance with an embodiment of the present invention. The phase lock loop 100 synchronizes an reference clock signal, ref_clk, to a signal with any one of a plurality of different frequencies, $f_1 \ldots f_n$, thereby providing a plurality of output signals $V_1 \ldots V_n$ with different frequencies.

The reference clock signal, ref_clk, is received at a phase detector 105. The phase detector 105 provides an output signal that is a function of the phase difference between the reference clock signal, ref_clk, and a feedback signal.

The phase lock loop comprises a voltage controlled oscillator (VCO). The VCO is centered at a particular frequency, f. The VCO provides a signal with a frequency that is offset from the center frequency, f. The offset is controllable by the voltage level applied to the VCO.

The output of the VCO is provided to a plurality of divider paths 110(1) . . . 110(n). Each divider path divides the frequency of the signal from VCO by a particular factor, thereby resulting in a plurality of signals $V_1 \ldots V_n$ at different fractions of the VCO frequency. By dividing the frequency of the VCO by a particular factor, the frequency of the VCO is equivalent to the frequency of the reference clock multiplied by the divider factor. The foregoing allows for accurate generation of a higher frequency signal from a reference clock. Inclusion of many divider paths allows numerous different output frequencies to be realized from a single reference clock.

Each of the divider paths 110(1) . . . 110(n) are connected to an N:1 multiplexer, MUX, which selectively feeds back a particular one of the divider paths 110(1). . . 110(n) to the phase detector 105.

This configurable voltage controlled oscillator of the present invention can also be used in conjunction with the teachings of "Transceiver System and Method Supporting Multiple Selectable Voltage Controlled Oscillators", Provisional Application for Patent, Ser. No. 60/423,072, Attorney Docket No. 14108US02, by Caresosa, et. al., which is incorporated herein by reference.

Figure 2:
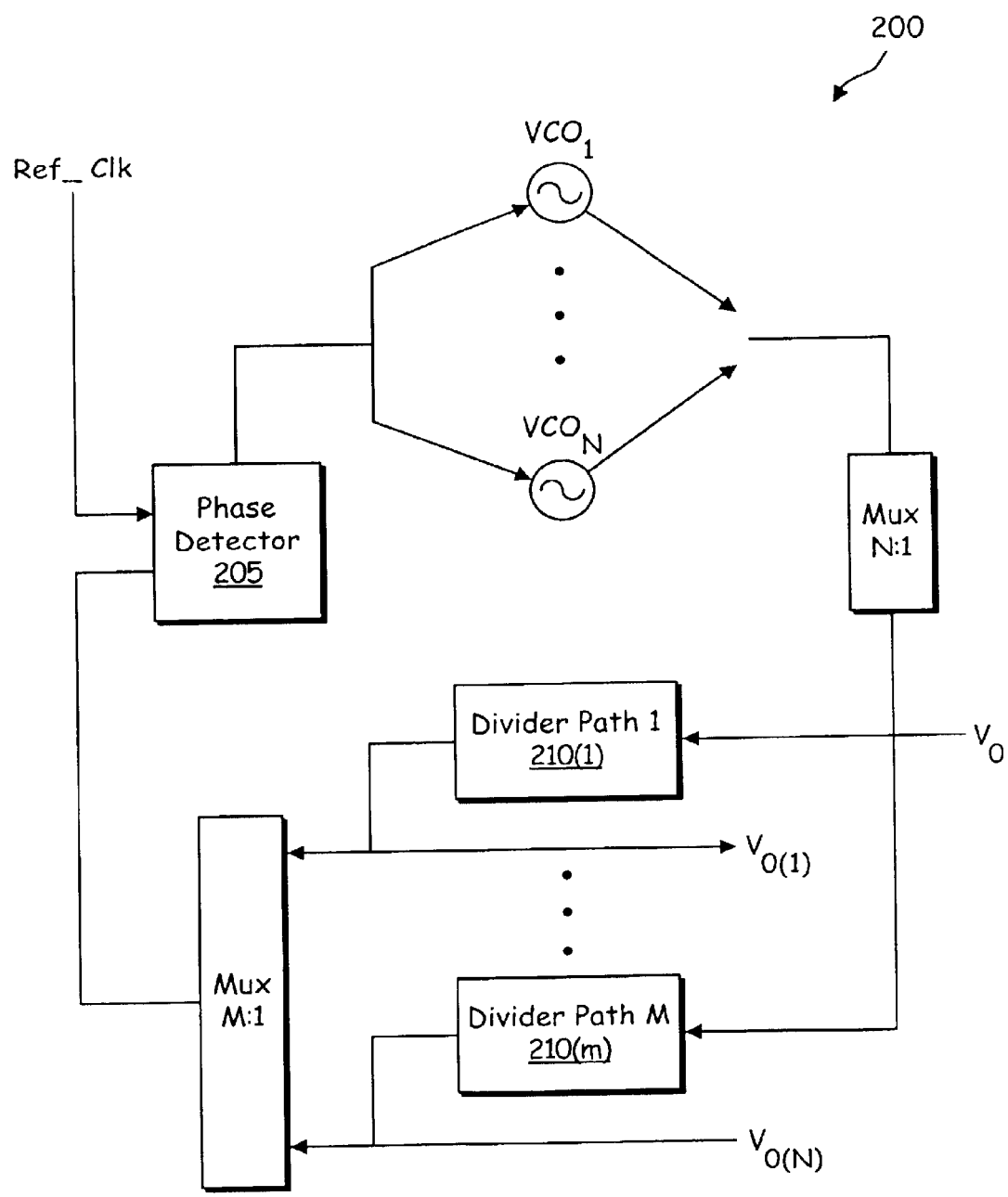
FIG. 2 is a block diagram of an exemplary phase lock loop with multiple voltage oscillators and multiple divider paths in accordance with an embodiment of the present invention.

Referring now to FIG. 2, there is illustrated a block diagram of an exemplary phase lock loop 200 with multiple divider paths and multiple selectable VCOs in accordance with an embodiment of the present invention. The phase lock loop 200 synchronizes reference clock signal, ref_clk, to a signal with any one of a plurality of different frequencies, thereby providing an output signal $V_{o(1)} \ldots V_{o(m)}$.

The reference clock signal, ref_clk, is received at a phase detector 205. The phase detector 205 provides an output signal that is a function of the phase difference between the reference clock signal, ref_clk, and a feedback signal.

The phase lock loop comprises a plurality of voltage controlled oscillators (VCOs), $VCO_1 \ldots VCO_n$. Each VCO, $VCO_1 \ldots VCO_n$, is centered at a particular frequency, $f_1 \ldots f_n$. The VCOs, $VCO_1 \ldots VCO_n$, provide a signal with a frequency that is offset from the center frequency. The offset is controllable by the voltage level applied to the VCO, $VCO_1 \ldots VCO_n$.

Each of the VCOs, $VCO_1 \ldots VCO_n$ are connected to an N:1 multiplexer, MUX, which selectively connects a particular one of the voltage controlled oscillators to a plurality of divider paths 210. The output of the VCO is provided to a plurality of divider paths 210(1). . . 210(m). Each divider path divides the signal from the selected VCO by a particular factor, thereby resulting in a plurality of signals $V_{o(1)} \ldots V_{o(m)}$ at different fractions of the VCO center frequency.

Each of the divider paths 210(0). . . 210(m) are connected to an m:1 multiplexer, MUX, which selectively feeds back a particular one of the divider paths 210(1). . . 210(m) to the phase detector 205.

Various embodiments of the present invention can be incorporated into a clock and data recovery (CDR) or clock multiplier unit (CMU) in a multirate transceiver, such as the multirate transceiver described in "TRANSCEIVER SYSTEM AND METHOD SUPPORTING VARIABLE RATES AND MULTIPLE PROTOCOLS", Provisional Application for patent Ser. No. 60/423,070, attorney docket no. 14103US02, by Caresosa, et. al., filed Nov. 1, 2002.

Figure 3:
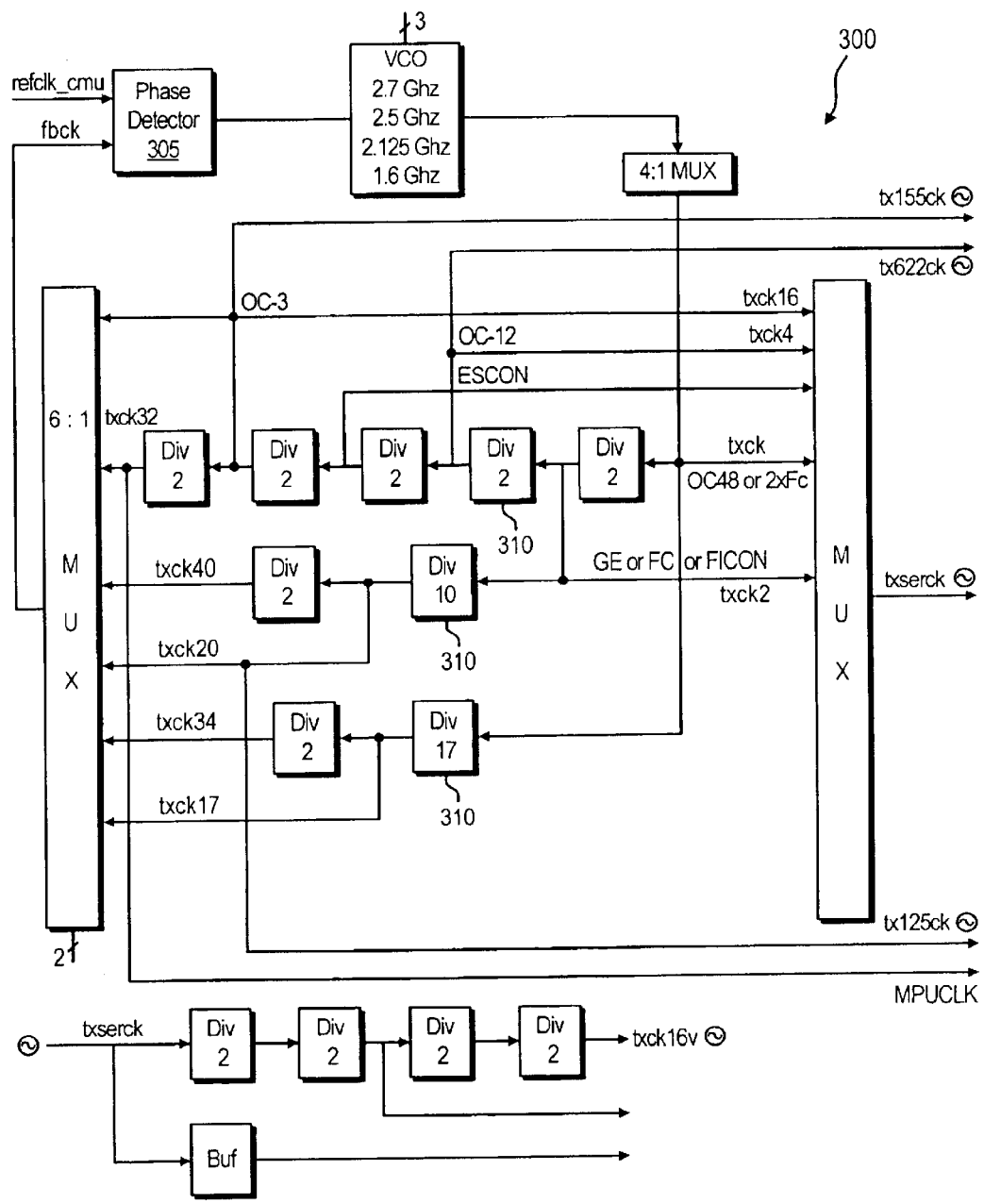
FIG. 3 is a block diagram of a clock multiplier unit in accordance with an embodiment of the present invention.

Referring now to FIG. 3, there is illustrated an exemplary CMU in accordance with an embodiment of the present invention. The CMU 300 synchronizes an reference clock signal, refclk_cmu, to a signal with any one of a plurality of frequencies.

The reference clock signal, refclk_cmu, is received at a phase detector 305. The phase detector 305 provides an output signal that is a function of the phase difference between the reference clock signal, refclk_cmu, and a feedback signal.

The phase lock loop comprises a plurality of VCO. The VCOs are centered at 1.6 Ghz, 2.12 Ghz, 2.5 Ghz, and 2.7 Ghz. The VCOs provide a signal with a frequency that is offset from the center frequency. The offset is controllable by the voltage level applied to the VCO.

Each of the VCOs is connected to an 4:1 multiplexer, MUX, which selectively connects a particular one of the voltage controlled oscillators to a plurality of divider paths 310. The divider paths 310 are realized from DIV 2, DIV 10, and DIV 17 dividers. It is noted that the dividers, DIV, may form a portion of one or more divider paths. The divider paths 310 provide clock signals for OC-3, OC-12, OC-48, ESCON, Gigabit Ethernet, FICON.

The dividers, DIV, provide signals to a 6:1 multiplexer, MUX, which selectively feeds back a particular one of the signals to the phase detector 305.

Additionally, a plurality of signals from the dividers, DIV, are also received at another multiplexer, MUX. The MUX selects a particular one of the plurality of signals and outputs the selected signal, txserck. The output signal, txserck, can also be received at additional dividers, DIV.

The CMU can be configured to output signals with a variety of frequency characteristics by appropriate selection of the reference clock frequency, VCO frequency, and the divider path. Various examples of frequencies that can be achieved, are listed below, along with the reference clock frequency, VCO frequency, and divider paths that can be used to achieve the frequency.

| Data Mode | Ref Clock frequency | VCO Out frequency | Divider Path/Value | txserck frequency |
|---|---|---|---|---|
| SONET Rates | | | | |
| FEC | 1.69E+08 | 2.70E+09 | 2 × 2 × 2 × 2->16 | 2.70E+09 |
|  | 8.44E+07 | 2.70E+09 | 2 × 2 × 2 × 2 × 2->32 | 2.70E+09 |
| OC48 | 1.56E+08 | 2.50E+09 | 2 × 2 × 2 × 2->16 | 2.50E+09 |
|  | 7.81E+07 | 2.50E+09 | 2 × 2 × 2 × 2 × 2->32 | 2.50E+09 |
| OC12 | 1.56E+08 | 2.50E+09 | 2 × 2 × 2 × 2->16 | 2.50E+09 |
|  | 7.81E+07 | 2.50E+09 | 2 × 2 × 2 × 2 × 2->32 | 2.50E+09 |
| OC3 | 1.56E+08 | 2.50E+09 | 2 × 2 × 2 × 2->16 | 2.50E+09 |
|  | 7.81E+07 | 2.50E+09 | 2 × 2 × 2 × 2 × 2->32 | 2.50E+09 |
| Gigabit Ethernet | 1.25E+08 | 2.50E+09 | 2 × 10->20 | 1.25E+09 |
|  | 6.25E+07 | 2.50E+09 | 2 × 10 × 2->40 | 1.25E+09 |
| Fibre-Channel | 1.06E+08 | 2.13E+09 | 2 × 10->20 | 1.06E+09 |
|  | 5.31E+07 | 2.13E+09 | 2 × 10 × 2->40 | 1.06E+09 |
|  | 1.25E+08 | 2.13E+09 | 17 | 1.06E+09 |
|  | 6.25E+07 | 2.13E+09 | 2 × 17->34 | 1.06E+09 |
| 2× Fibre-Channel | 1.06E+08 | 2.13E+09 | 2 × 10->20 | 2.13E+09 |
|  | 5.31E+07 | 2.13E+09 | 2 × 2 × 10->40 | 2.13E+09 |
|  | 1.25E+08 | 2.13E+09 | 17 | 2.13E+09 |
|  | 6.25E+07 | 2.13E+09 | 2 × 17->34 | 2.13E+09 |
| FICON | 8.00E+07 | 1.60E+09 | 2 × 10->20 | 8.00E+08 |
|  | 4.00E+07 | 1.60E+09 | 2 × 2 × 10->40 | 8.00E+08 |
| ESCON | 8.00E+07 | 1.60E+09 | 2 × 10->20 | 2.00E+08 |
|  | 4.00E+07 | 1.60E+09 | 2 × 2 × 10->40 | 2.00E+08 |

Figure 4:
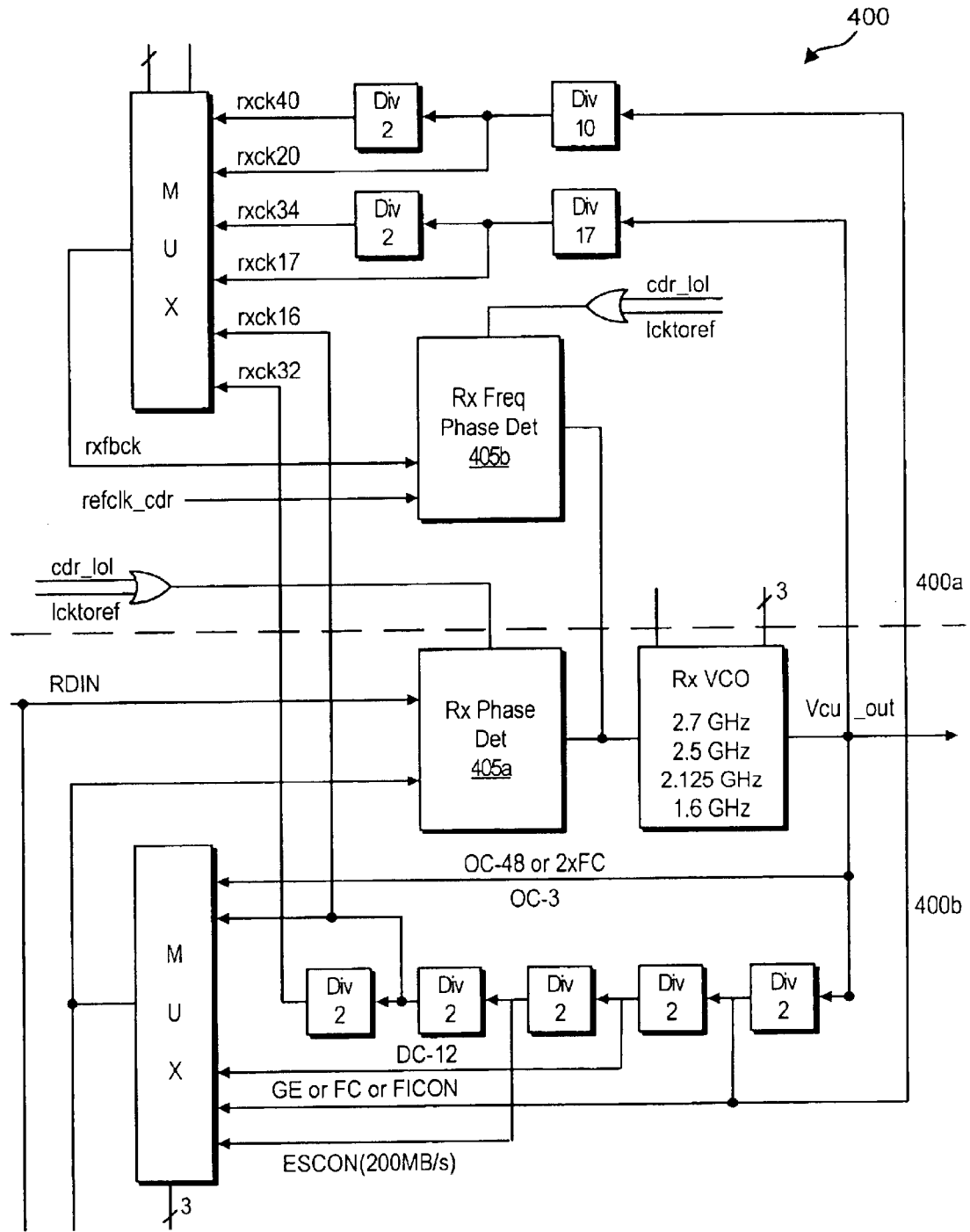
FIG. 4 is a block diagram of an exemplary CDR in accordance with an embodiment of the present invention.

Referring now to FIG. 4, there is illustrated a block diagram of an exemplary CDR 400 in accordance with an embodiment of the invention. The CDR 400 includes a frequency acquisition circuit loop 400a and a phase acquisition loop 400b.

The CDR 400 operates in one of two modes—a frequency acquisition mode, and a phase acquisition mode. At startup, the CDR 400 operates in the frequency acquisition mode wherein the frequency acquisition circuit loop 400a locks the frequency of a reference signal, efclk_cdr to a particular one of the frequencies. The particular frequency signal is generated by selection of a particular one of the VCOs in RxVCO and a particular one of the divider paths.

Upon frequency acquisition, the CDR 400 enters the phase acquisition mode. During the phase acquisition mode, the phase acquisition circuit loop 400b synchronizes an incoming data signal with a particular one of the frequencies. The particular frequency signal is generated by selection of a particular one of the VCOs in RxVCO and particular one of the divider paths.

Figure 5:
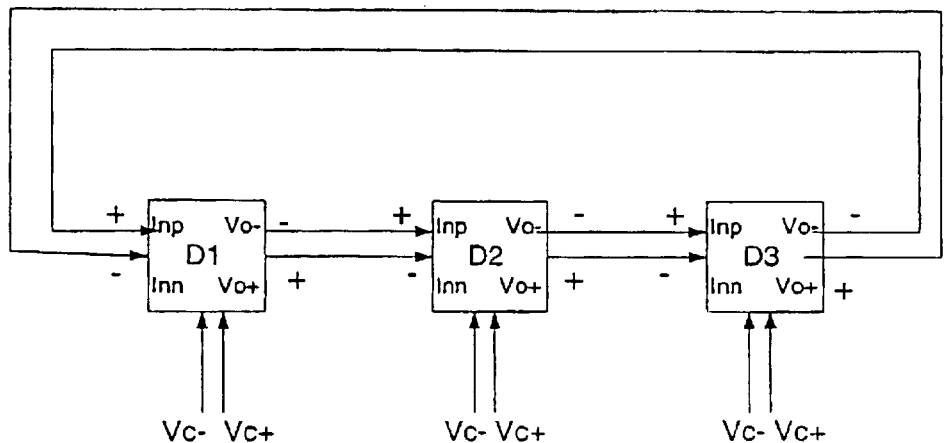
FIG. 5 is a block diagram of an exemplary oscillator.

Referring now to FIG. 5, there is illustrated a block diagram describing an exemplary VCO 500. The VCO 500 comprises delay units, D1, D2, and D3, connected in cascade. The delay units can comprise, for example, delay interpolators. The output of delay unit, D3, is provided is inverted and fed back to delay unit, D1.

The delay units, D1, D2, D3 delay an input signal for a certain period of time, T, before outputting the signal. Accordingly, an input pulse received at delay unit, D1, at time=0 is reaches the output of delay unit, D3, at time=3T. Therefore, the output generates a signal with a frequency, 1/(6T).

The period of time that the delay units, D1, D2, and D3 delay an input signal is controllable by a control voltage, Vc. A particular frequency, within a certain range, can be achieved by controlling the control voltage.

Figure 6:
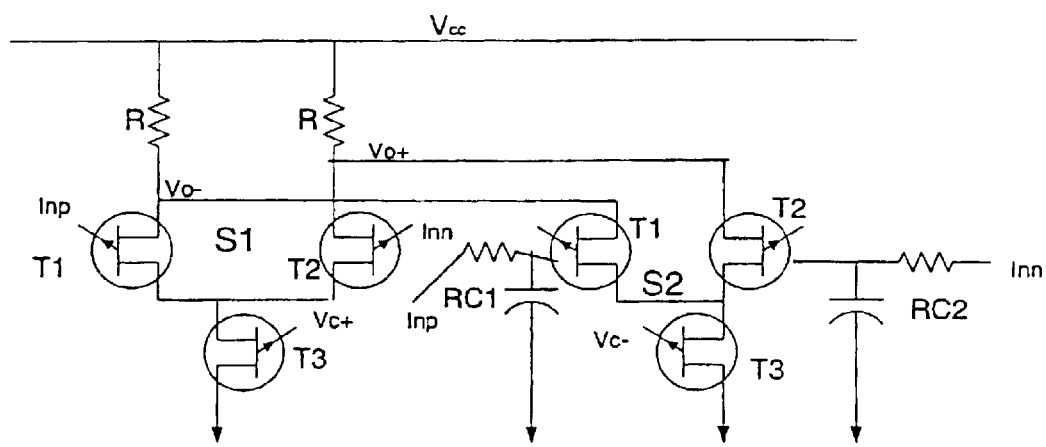
FIG. 6 is a block diagram of an exemplary delay unit.

Referring now to FIG. 6, there is illustrated a block diagram describing an exemplary delay interpolator. The delay interpolator comprises two stages, S1, S2. Each stage provides a different delay period, $T_{s1}$, $T_{s2}$. The delay period for the interpolator is a weighted sum, $w_1 T_{s1} + w_2 T_{s2}$, where $w_1 + w_2 = 1$. The weights, $w_1$, $w_2$ are controllable by the control voltage, $V_c$.

Each stage S1, S2 comprises three transistors, T1, T2, and T3, wherein transistors T1 and T2 are connected in parallel with respect to each other, and in series with respect to transistor T3. The transistors, T1 and T2, are also connected to resistors R.

The delay interpolator includes input terminals for receiving a control voltage. In the stage, S1, the input terminal for receiving the positive control voltage, Vc+, is connected to the gate of transistor T3 of stage S1, while the terminal for receiving the negative control voltage, Vc−, is connected to the gate of transistor T3 of stage S2.

In the stage S2, resistor/capacitor (RC) circuits, RC1, RC2, are connected to the gates of the transistors T1, T2, respectively. The input terminal for receiving positive Inp is connected to the resistor portion of the RC circuit RC1. The input terminal for receiving Inn, is connected to the resistor portion of the RC circuit RC2. The output of the delay interpolator is the differential voltage between the drains of transistors T1 and T2 of the first stage S1 and the second stage S2. These outputs are subsequently connected to the inputs of the next delay cell. However, the positive output of the current delay cell is connected to the negative input of the next delay cell, while the negative output of the current delay cell is connected to the positive input of the next delay cell. The foregoing connection causes the phase shift resulting in the control of the Vco frequency.

The phase lock loop as described herein may be implemented as a board level product, as a single chip, application specific integrated circuit, or with varying levels of the phase lock loop integrated on a single chip with other portions of the system as separate components. The degree of integration of the monitoring system will primarily be determined by the data speeds, and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor can be implemented as part of an ASIC device.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A phase lock loop comprising:

a phase detector;

a voltage controlled oscillator connected to the phase detector;

a plurality of divider paths connected to said voltage controlled oscillator;

a multiplexer connected to said plurality of divider paths and said phase detector; and at least one divider forming a portion of two or more of the plurality of divider paths.

2. The phase lock loop of claim 1, wherein the voltage controlled oscillator further comprises a ring oscillator.

3. The phase lock loop of claim 1, further comprising:
a plurality of outputs connected to the divider paths, wherein the outputs provide a corresponding plurality of frequency signals.

4. The phase lock loop of claim 3, wherein the plurality of frequency signals comprise:
frequency signals for OC-3, OC-12, OC-48, and Gigabit Ethernet.

5. A phase lock loop system for synchronizing an input signal, said phase lock loop system comprising:
a phase detector for comparing phases between the input signal and a feedback signal and providing a control signal, wherein the control signal is dependent on a difference in phase between the input signal and the feedback signal;
a voltage controlled oscillator for generating a frequency signal, wherein the frequency signal is dependent on the control signal;
a plurality of divider paths for dividing the frequency of the frequency signal;
a multiplexer for providing the feedback signal to the phase detector;
at least one divider forming a portion of two or more of the plurality of divider paths.

6. The phase lock loop of claim 5, wherein the multiplexer selects a particular one of the divider paths, and wherein a signal from the selected divider path is the feedback signal.

7. The phase lock loop of claim 5, wherein the voltage controlled oscillator further comprises a ring oscillator.

8. The phase lock loop of claim 5, further comprising:
a plurality of outputs for outputting a corresponding plurality of output frequency signals.

9. The phase lock loop of claim 8, wherein the plurality of output frequency signals further comprise an OC-3 signal, an OC-12 signal, an OC-48 signal, and a Gigabit Ethernet signal.

10. The phase lock loop of claim 8, further comprising at least one divider for multiplying the frequency of a particular one of the plurality of output frequency signals.

* * * * *